United States Patent [19]

Felkel et al.

[11] 4,284,898

[45] Aug. 18, 1981

[54] HIGH VOLTAGE STABLE OPTICAL COUPLER

[75] Inventors: Gerfried Felkel, Neubiberg; Joerg Klann, Laaber, both of Fed. Rep. of Germany

[73] Assignee: Siemens Aktiengesellschaft, Berlin & Munich, Fed. Rep. of Germany

[21] Appl. No.: 8,103

[22] Filed: Jan. 31, 1979

[30] Foreign Application Priority Data

Feb. 14, 1978 [DE] Fed. Rep. of Germany ....... 2806167

[51] Int. Cl.³ ............................................. G02B 27/00
[52] U.S. Cl. ........................................ 250/551; 357/19
[58] Field of Search ........................... 250/551; 357/19

[56] References Cited

U.S. PATENT DOCUMENTS

| | | | |
|---|---|---|---|
| 4,112,308 | 9/1978 | Olschewski et al. | 250/551 |
| 4,114,177 | 9/1978 | King | 250/551 X |
| 4,156,148 | 5/1979 | Kaufman | 250/551 |
| 4,160,308 | 7/1979 | Courtney et al. | 250/551 X |

FOREIGN PATENT DOCUMENTS 2703465  4/1977  Fed. Rep. of Germany.

Primary Examiner—David C. Nelms
Assistant Examiner—Darwin R. Hostetter
Attorney, Agent, or Firm—Hill, Van Santen, Steadman, Chiara & Simpson

[57] ABSTRACT

An optical coupler has a radiation transmitter and a radiation receiver with a coupling medium disposed therebetween and surrounded by an enveloping mass. In order to avoid electric disruptive breakdowns in the boundary area between the coupling medium and the enveloping mass, an insulating film is applied on the surface of the conductor bands which carry the radiation transmitter and the radiation receiver, respectively.

10 Claims, 1 Drawing Figure

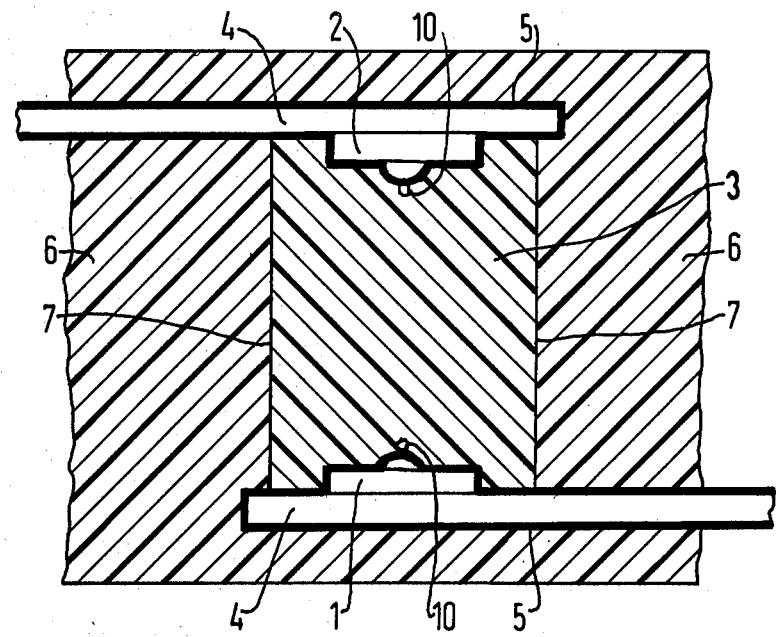

HIGH VOLTAGE STABLE OPTICAL COUPLER

BACKGROUND OF THE INVENTION

1. Field of the Invention

The present invention relates to a high voltage stable optical coupler comprising a radiation transmitter and a radiation receiver, each arranged on a conductor band and having a translucent coupling medium therebetween which is at least partially enveloped a non-translucent mass.

2. Description of the Prior Art

An optical coupler is known in the art in which a glass layer of high dielectric strength is arranged between a radiation transmitter and a radiation receiver, in order to be able to operate at higher voltages. A coupler of this type is disclosed, for example, in the German Offenlegungsschrift No. 27 03 465.

If, in the case of an optical coupler, the coupling medium and the enveloping mass consist of different materials, it has been shown that an electric disruptive breakdown occurs, primarily at the boundary surface between the coupling medium and the enveloping mass. Accordingly, optical couplers are often manufactured in which the coupling medium and the enveloping mass consist of the same material. Nevertheless, however, optical couplers having different materials for the coupling medium and the enveloping mass are preferred for many applications, so that presently two production lines are introduced for the manufacture of front couplers; namely, a production line for high voltage stable optical couplers having one material for both the coupling medium and the enveloping mass, and an additional production line for manufacturing optical couplers having different materials for the coupling medium and the enveloping mass.

SUMMARY OF THE INVENTION

It is the primary object of the present invention to provide an optical coupler having different materials for the coupling medium and the enveloping mass and which is, however, nevertheless sufficiently stable with respect to high voltage applications.

The above object is achieved, according to the present invention, by means of introduction of a translucent insulating film on at least one of the conductor bands which carry the radiation transmitter and the radiation receiver.

The insulating film which, for example, can consist of silicon lacquer or epoxide lacquer, is applied on the conductor band subsequent to the application of the radiation transmitter or radiation receiver, respectively, and thus prevents an electric breakdown at the boundary surface between the coupling medium and the enveloping mass. The dielectric strength of the optical coupler can thereby be increased to 10 kV. Prior to the application of insulating film, in particular, the edges of the conductor band can be polished, as a consequence of which a complete covering of the conductive band by the insulating layer is effected.

In a further development of the invention, it is provided that the insulating film consists of the same material as the coupling medium.

Moreover, it is advantageous that the enveloping mass be a silicon molding compound or an epoxide molding compound or casting resin.

Finally, a further feature of the invention additionally provides that the insulating film on the conductor bands extends to the proximity of the exit of the conductor bands from the enveloping mass. It is thereby guaranteed that no electric disruptive breakdown can occur around the insulating film to the boundary surface between the coupling medium and the enveloping mass.

BRIEF DESCRIPTION OF THE DRAWING

Other objects, features and advantages of the invention, its organization, construction and operation will be best understood from the following detailed description, taken in conjunction with the accompanying drawing, on which there is a single FIGURE which illustrates, in a fragmentary sectional view, an optical coupler constructed in accordance with the present invention.

DESCRIPTION OF THE PREFERRED EMBODIMENTS

Referring to the drawing, the optical coupler is shown as comprising a radiation transmitter 1 and a radiation receiver 2 which are carried on respective conductor bands 4. The radiation transmitter 1 can be a luminescent diode, whereas a photodiode or a phototransistor can be provided for the radiation receiver 2. A coupling medium 3, consisting for example, of silicon lacquer, is disposed between the radiation transmitter 1 and the radiation receiver 2. The coupling medium 3 is surrounded or enveloped by an enveloping mass 6 which consist of silicon molding compound and which, in contrast to the coupling medium 3, is non-translucent.

The radiation transmitter 1 and the radiation receiver 2 each have lead wires 10, only schematically illustrated, which are connected to the respective conductor bands 4.

When a high voltage is applied between the radiation transmitter 1 and the radiation receiver 2, an electric disruptive breakdown can occur, in particular at the boundary surface 7 between the coupling medium 3 and the enveloping mass 6.

According to the present invention, such a distruptive breakdown is prevented by the provision of an insulating film on at least one, and preferably both, of the conductor bands 4. The insulating film 5 may consist of, for example, silicon lacquer and may advantageously extend to the proximity of the emergence of the conductor bands from the enveloping mass 6. The insulating film 5 is translucent and can therefore also cover the radiation transmitter 1 and the radiation receiver 2, respectively, without impairing the function of the optical coupler.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a high voltage stable optical coupler of the type wherein a radiation transmitter and a radiation receiver are mounted on respective conductors, a transluscent coupling medium is disposed between the transmitter and the receiver, and a non-transluscent enveloping mass surrounds the coupling medium and has the conductors extending therethrough, the improvement therein comprising:

a radiation-permeable transluscent insulating film completely covering at least one of the conductors.

2. The improved optical coupler of claim 1, further defined in that each of the conductors is covered with a radiation-permeable transluscent insulating film.

3. The improved optical coupler of claim 1, wherein the radiation-permeable transluscent insulating film comprises silicon lacquer.

4. The improved optical coupler of claim 1, wherein the radiation-permeable transluscent insulating film comprises epoxide lacquer.

5. The improved optical coupler of claim 1, wherein the radiation-permeable insulating film and the coupling medium comprise the same transluscent material.

6. The improved optical coupler of claim 1, wherein the enveloping mass comprises a silicon molding material.

7. The improved optical coupler of claim 1, wherein the enveloping mass comprises an epoxide molding material.

8. The improved optical coupler of claim 1, wherein the enveloping mass comprises a casting resin.

9. The improved optical coupler of claim 1, further defined in that said radiation-permeable insulating film also covers the radiation device carried by the one conductor.

10. The improved optical coupler of claim 1, further defined in that the radiation-permeable insulating film extends in proximity of the exit of the conductor from the enveloping mass.

* * * * *